(12) United States Patent
He

(10) Patent No.: US 11,406,030 B2
(45) Date of Patent: Aug. 2, 2022

(54) ROLLABLE FLEXIBLE DISPLAY DEVICE

(71) Applicant: WUHAN CHINA STAR OPTOELECTRONICS SEMICONDUCTOR DISPLAY TECHNOLOGY CO., LTD., Hubei (CN)

(72) Inventor: Ping He, Hubei (CN)

(73) Assignee: WUHAN CHINA STAR OPTOELECTRONICS SEMICONDUCTOR DISPLAY TECHNOLOGY CO., LTD., Hubei (CN)

(*) Notice: Subject to any disclaimer, the term of this patent is extended or adjusted under 35 U.S.C. 154(b) by 202 days.

(21) Appl. No.: 16/769,999

(22) PCT Filed: Apr. 21, 2020

(86) PCT No.: PCT/CN2020/085765
§ 371 (c)(1),
(2) Date: Jun. 4, 2020

(87) PCT Pub. No.: WO2021/203465
PCT Pub. Date: Oct. 14, 2021

(65) Prior Publication Data
US 2022/0124920 A1 Apr. 21, 2022

(30) Foreign Application Priority Data
Apr. 10, 2020 (CN) .......................... 202010277128.8

(51) Int. Cl.
*H05K 5/02* (2006.01)
*G06F 1/16* (2006.01)
(Continued)

(52) U.S. Cl.
CPC ......... *H05K 5/0217* (2013.01); *G06F 1/1652* (2013.01); *H01L 51/0097* (2013.01); *H05K 5/0017* (2013.01); *H01L 2251/5338* (2013.01)

(58) Field of Classification Search
CPC .. H05K 5/0217; H05K 5/0017; G06F 1/1652; H01L 51/0097; H01L 2251/5338; G09F 9/301; G09F 9/33
See application file for complete search history.

(56) References Cited

U.S. PATENT DOCUMENTS

RE47,987 E    5/2020   Walters et al.
11,127,322 B2 *   9/2021   Han .................. G09F 9/301
(Continued)

FOREIGN PATENT DOCUMENTS

CN     103514809 A     1/2014
CN     203746358 U *   7/2014
(Continued)

*Primary Examiner* — Abhishek M Rathod

(57) ABSTRACT

The present invention provides a rollable flexible display device. The flexible display module of the present invention is covered with strip structures. Material of the strip structures is flexible silicone material, and the strip structure are embedded with universal ball assemblies having a very low sliding resistance, and a special reel mechanism is also used, and distal ends of the reel are disposed with universal ball assemblies. The conventional spiral spring mechanism is replaced, sliding is replaced by rolling to reduce contact friction. Therefore, phenomenon of jammed situation and un-smooth motion is mitigated.

12 Claims, 7 Drawing Sheets

(51) Int. Cl.
 *H05K 5/00* (2006.01)
 *H01L 51/00* (2006.01)

(56) References Cited

U.S. PATENT DOCUMENTS

| | | | |
|---|---|---|---|
| 11,140,252 B1* | 10/2021 | Choi | G06F 1/1643 |
| 2008/0049003 A1* | 2/2008 | Hasegawa | G06F 1/1637 |
| | | | 345/206 |
| 2015/0047796 A1* | 2/2015 | Peng | E06B 9/42 |
| | | | 160/323.1 |
| 2016/0161983 A1* | 6/2016 | Lee | G09F 9/301 |
| | | | 361/749 |
| 2016/0165717 A1 | 6/2016 | Lee et al. | |
| 2016/0363960 A1* | 12/2016 | Park | G09F 9/301 |
| 2017/0023978 A1* | 1/2017 | Cho | G06F 1/1652 |
| 2017/0359911 A1 | 12/2017 | Hayk et al. | |
| 2018/0102072 A1* | 4/2018 | Lee | G09F 9/301 |
| 2019/0182947 A1* | 6/2019 | Xiang | G02F 1/133305 |
| 2020/0152095 A1 | 5/2020 | Lee et al. | |
| 2020/0341518 A1* | 10/2020 | Zhang | G09F 11/02 |
| 2020/0366331 A1* | 11/2020 | Chen | G06F 1/1656 |

FOREIGN PATENT DOCUMENTS

| | | | |
|---|---|---|---|
| CN | 203746358 U | | 7/2014 |
| CN | 106205396 A | | 12/2016 |
| CN | 106251779 A | | 12/2016 |
| CN | 107492309 A | | 12/2017 |
| CN | 107919063 A | | 4/2018 |
| CN | 109027732 A | | 12/2018 |
| CN | 208368047 U | | 1/2019 |
| CN | 110271917 A | | 9/2019 |
| CN | 209654559 U | * | 11/2019 |
| CN | 209654559 U | | 11/2019 |
| CN | 210270658 U | | 4/2020 |

* cited by examiner

ROLLABLE FLEXIBLE DISPLAY DEVICE

FIELD OF INVENTION

The present invention relates to a field of display panel manufacturing technologies, especially relates to a rollable flexible display device.

BACKGROUND OF INVENTION

An organic light emitting diode (OLED) display screen is currently used in foldable mobile phones, smart watches, and in-vehicle displays and other flexible display products due to its advantages such as lightness, thinness, and flexible foldability. Concepts of rollable products with greater bending capabilities have been already presented in various exhibitions and become an important creative technology after folding products. In order to achieve the overall free roll, the flexible material of each layer of the OLED module needs to be used to improve the smoothness of the module in the mechanism.

Gaps are defined between a conventionally designed rollable flexible display mechanism edge and a rolling mechanism edge in advance such that a module can roll up freely in the mechanism. However, actually the rollable flexible display mechanism is often jammed, and the movement is not smooth. One of reasons of jammed situation is a frictional resistance occurring between the module edge and the mechanism during the rolling motion. Furthermore, a central reel portion frequently employs a spiral spring type mechanism capable of providing a drag force automatically rolling the stretched flexible display module into the mechanism, and such mechanism requires different torques under different situations and is difficult to control, which easily damages the rollable flexible display mechanism.

Therefore, it is required to design a novel structure to solve the technical issue that the reel of the conventional rollable flexible display device is often jammed, and the movement is not smooth, a great frictional resistance occurring between the module edge and the mechanism during the rolling motion, and the central reel under different situations receives different rolling-up forces.

SUMMARY OF INVENTION

Technical Issue

The present invention provides a rollable flexible display device that is able to solve the technical issue that the reel of the conventional rollable flexible display device is often jammed, and the movement is not smooth, a great frictional resistance occurring between the module edge and the mechanism during the rolling motion, and the central reel under different situations receives different rolling-up forces.

Technical Solution

To solve the above issue, the present invention provides technical solutions as follows.

The present invention provides a rollable flexible display device, comprising a reel and a flexible display module, the flexible display module rolling around the reel or stretching out from the reel under an external force, wherein two strip structures cover two sides of the flexible display module respectively, two first roller mechanisms are disposed on the strip structures respectively, two second roller mechanisms are disposed on two ends of the reel respectively, and the first roller mechanisms roll around the second roller mechanisms respectively during rolling-up or stretching of the flexible display module.

According to a preferred embodiment of the present invention, material of the strip structures is flexible silicone material, and the flexible silicone material has elasticity and prestress.

According to a preferred embodiment of the present invention, the first roller mechanisms comprise a first sub-roller mechanism and a second sub-roller mechanism, the first sub-roller mechanism comprises universal balls disposed on one side of the flexible display module and arranged along a longitudinal direction, the second sub-roller mechanism comprises universal balls disposed on the other side of the flexible display module and arranged along the longitudinal direction, the second roller mechanisms comprise a third sub-roller mechanism and a fourth sub-roller mechanism, the third sub-roller mechanism comprises a universal ball embedded in one of two ends of the reel, the fourth sub-roller mechanism comprises a universal ball embedded in the other end of the reel, the first sub-roller mechanism rolls around the third sub-roller mechanism, and the second sub-roller mechanism rolls around the fourth sub-roller mechanism.

According to a preferred embodiment of the present invention, a stretched length of the first sub-roller mechanism is greater than a perimeter of the third sub-roller mechanism, and a stretched length of the second sub-roller mechanism is greater than a perimeter of the fourth sub-roller mechanism.

According to a preferred embodiment of the present invention, two second auxiliary roller mechanisms are disposed symmetrically on the each end of the reel respectively, two first auxiliary roller mechanisms are disposed on each of the strip structures and correspond to the second auxiliary roller mechanisms, and the first auxiliary roller mechanisms roll around the second auxiliary roller mechanisms respectively.

According to a preferred embodiment of the present invention, the two second auxiliary roller mechanisms are located on two sides of each of the second roller mechanisms, and central points of the two second auxiliary roller mechanisms and a central point of the second roller mechanisms form an isosceles triangle.

According to a preferred embodiment of the present invention, a distance between centers of the two second auxiliary roller mechanisms is equal to a thickness of each of the strip structures.

According to a preferred embodiment of the present invention, the display device further comprises an outer casing, two spiral grooves are defined in two inner sides of the outer casing respectively, the flexible display module stretches and retracts around the reel and along the grooves, and a baffle is disposed on the outer casing corresponding to an entrance of the flexible display module.

According to a preferred embodiment of the present invention, the flexible display module is an organic light emitting diode (OLED) display device or a Mini-LED display device.

According to a preferred embodiment of the present invention, a size of each of the universal balls of the first roller mechanisms is less than a size of each of the universal balls of the second roller mechanisms.

The present invention also provides a rollable flexible display device, comprising a reel and a flexible display module, the flexible display module rolling around the reel or stretching out from the reel under an external force, wherein two strip structures cover two sides of the flexible display module respectively, two first roller mechanisms are disposed on the strip structures respectively, two second roller mechanisms are disposed on two ends of the reel respectively, and the first roller mechanisms roll around the second roller mechanisms respectively during rolling-up or stretching of the flexible display module, wherein the second roller mechanisms comprises a base disposed securely on the reel and a universal ball disposed slidably on the base, each of the first roller mechanisms comprises circular recesses and universal balls disposed in inner surfaces of the circular recesses respectively, and the universal ball of each of the second roller mechanisms and the circular recesses of each of the first roller mechanisms are disposed in a corresponding position.

According to a preferred embodiment of the present invention, material of the strip structures is flexible silicone material, the flexible silicone material has elasticity and prestress.

According to a preferred embodiment of the present invention, the first roller mechanisms comprise a first sub-roller mechanism and a second sub-roller mechanism, the first sub-roller mechanism comprises universal balls disposed on one side of the flexible display module and arranged along a longitudinal direction, the second sub-roller mechanism comprises universal balls disposed on the other side of the flexible display module and arranged along the longitudinal direction, the second roller mechanisms comprise a third sub-roller mechanism and a fourth sub-roller mechanism, the third sub-roller mechanism comprises a universal ball embedded in one of two ends of the reel, the fourth sub-roller mechanism comprises a universal ball embedded in the other end of the reel, the first sub-roller mechanism rolls around the third sub-roller mechanism, and the second sub-roller mechanism rolls around the fourth sub-roller mechanism.

According to a preferred embodiment of the present invention, a stretched length of the first sub-roller mechanism is greater than a perimeter of the third sub-roller mechanism, and a stretched length of the second sub-roller mechanism is greater than a perimeter of the fourth sub-roller mechanism.

According to a preferred embodiment of the present invention, two second auxiliary roller mechanisms are disposed symmetrically on the each end of the reel respectively, two first auxiliary roller mechanisms are disposed on each of the strip structures and correspond to the second auxiliary roller mechanisms, and the first auxiliary roller mechanisms roll around the second auxiliary roller mechanisms respectively.

According to a preferred embodiment of the present invention, the two second auxiliary roller mechanisms are located on two sides of each of the second roller mechanisms, and central points of the two second auxiliary roller mechanisms and a central point of the second roller mechanisms form an isosceles triangle.

According to a preferred embodiment of the present invention, a distance between centers of the two second auxiliary roller mechanisms is equal to a thickness of each of the strip structures.

According to a preferred embodiment of the present invention, the display device further comprises an outer casing, two spiral grooves are defined in two inner sides of the outer casing respectively, the flexible display module stretches and retracts around the reel and along the grooves, and a baffle is disposed on the outer casing corresponding to an entrance of the flexible display module.

According to a preferred embodiment of the present invention, the flexible display module is an organic light emitting diode (OLED) display device or a Mini-LED display device.

According to a preferred embodiment of the present invention, a size of each of the universal balls of the first roller mechanisms is less than a size of each of the universal balls of the second roller mechanisms.

Advantages

The present invention provides a rollable flexible display device, the flexible display module of the present invention is covered with the strip structures, material of the strip structures is flexible silicone material, and the strip structures are embedded with universal ball assemblies with a very low sliding resistance, and a special reel mechanism is also used, and distal ends of the reel are disposed with universal ball assemblies. The conventional spiral spring mechanism is replaced, sliding is replaced by rolling to reduce contact friction. The rollable flexible display device employing such special mechanism can drastically decrease the friction to mitigate frequent jammed situation and the un-smooth movement, and to mitigate the issue of an intervening status thereof receiving different inward drag forces to enhance user experience.

DESCRIPTION OF DRAWINGS

To more clearly elaborate on the technical solutions of embodiments of the present invention or prior art, appended figures necessary for describing the embodiments of the present invention or prior art will be briefly introduced as follows. Apparently, the following appended figures are merely some embodiments of the present invention. A person of ordinary skill in the art may acquire other figures according to the appended figures without any creative effort.

DETAILED DESCRIPTION OF PREFERRED EMBODIMENTS

Figure 1:
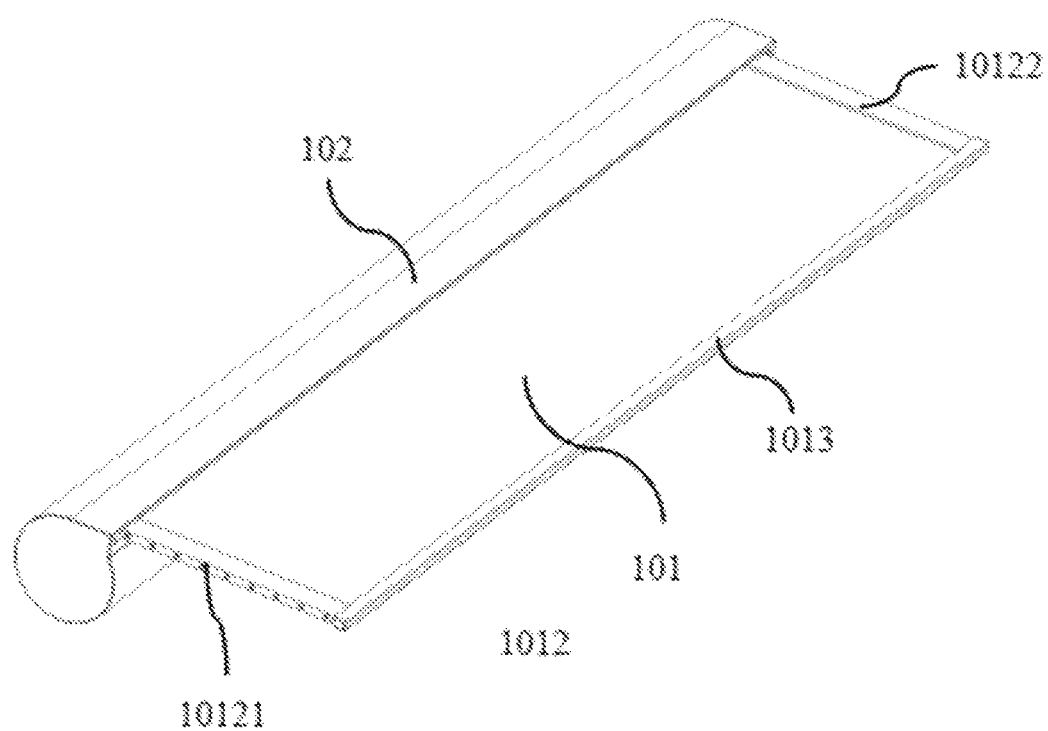
FIG. 1 is a schematic structural view of a rollable flexible display device provided by the present invention.

Each of the following embodiments is described with appending figures to illustrate specific embodiments of the present invention that are applicable. The terminologies of direction mentioned in the present invention, such as "upper", "lower", "front", "rear", "left", "right", "inner", "outer", "side surface", etc., only refer to the directions of the appended figures. Therefore, the terminologies of direction are used for explanation and comprehension of the present invention, instead of limiting the present invention. In the figures, units with similar structures are marked with the same reference characters. Broken lines in the figures shows that non-existing structure and are only for explanation of shapes and positions of structures.

The present invention aims at the technical issue that the reel of the conventional rollable flexible display device is often jammed, and the movement is not smooth, a great frictional resistance occurring between the module edge and the mechanism during the rolling motion, and the central reel under different situations receives different rolling-up forces. The present embodiment can solve the defects.

Figure 2:
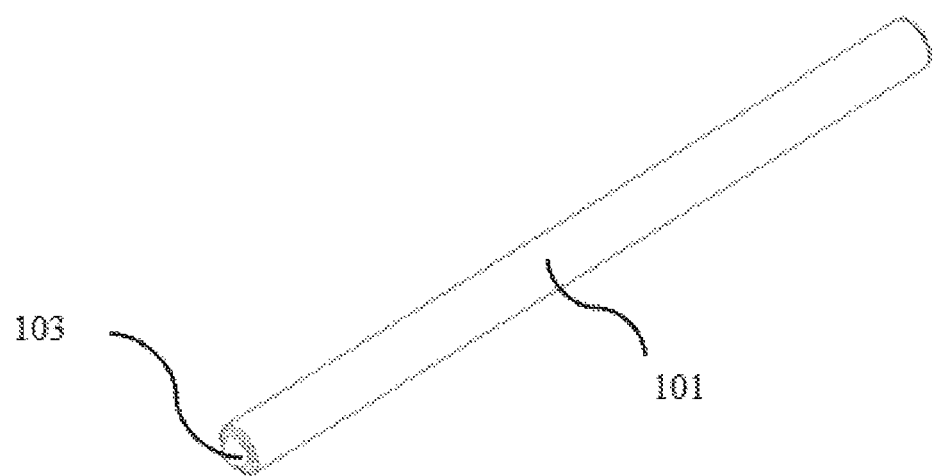
FIG. 2 is a schematic structural view of a rollable flexible display device provided by the present invention rolling.

With reference to FIGS. 1 and 2, the present invention provides a rollable flexible display device comprising a reel 103, a flexible display module 101, and an outer casing 102 accommodating the reel 103 and the flexible display module 101. The flexible display module 101 rolls up and stretches according to rotation of the reel 103. The reel 103 is connected to an electronic device or a pneumatic device. The electronic device or the pneumatic device controls the reel 103 to rotate clockwise or counterclockwise. The reel 103 rotates clockwise and the flexible display module 101 rolls up. The reel 103 rotates counterclockwise and the flexible display module 101 stretches. The flexible display module 101 is preferably an organic light emitting diode (OLED) display device or a mini-LED display device. To solve the phenomenon that the flexible display module 101 suffers great friction during rolling-up or stretching and an intervening status thereof receives different inward drag forces to result in frequently jammed situation and un-smooth motion of the reel 103 connected to the flexible display device 101, the present invention embodiment comprises two strip structures 1012 covering two sides of the flexible display module 101 respectively. Two first roller mechanisms are disposed on the strip structures 1012 respectively, and each of the first roller mechanisms is arranged linearly on each of the strip structures 1012. Two second roller mechanisms are disposed on two distal ends of the reel 103 and correspond to the first roller mechanisms. During operation of the flexible display module 101, the first roller mechanisms rolls around the second roller mechanisms. Each of the second roller mechanisms comprises a base disposed securely on the reel and a universal ball disposed slidably on the base. Each of the first roller mechanisms comprises circular recesses and universal balls disposed in inner surfaces of the circular recess respectively, and the universal ball of each of the second roller mechanisms and the circular recesses of each of the first roller mechanisms are disposed in a corresponding position. For example, the strip structures 1012 comprises a left side strip structure 10121 and a right side strip structure 10122 that are disposed opposite to each other, and a cross section of each of the left side strip structure 10121 and the right side strip structure 10122 is preferably rectangular. Material of the strip structures 1012 is flexible silicone material, the flexible silicone material has elasticity and prestress, the first roller mechanisms are disposed on the left side strip structure 10121 and the right side strip structure 10122 respectively and symmetrically. The second roller mechanisms are disposed on the distal ends of the reel 103 respectively and correspond to the first roller mechanisms. The first roller mechanisms are disposed around the second roller mechanisms respectively to form rolling sets. The first roller mechanisms are universal ball assemblies. The second roller mechanisms are also universal ball assemblies. In another embodiment, the second roller mechanisms can also be a roller shaft, and can be a sliding track.

Figure 3:
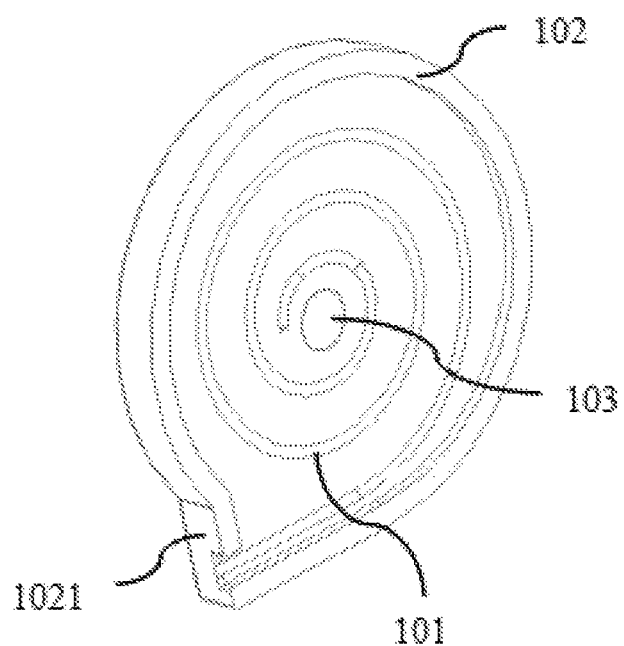
FIG. 3 is a schematic cross-sectional structural view of a reeling structure of the rollable flexible display device provided by the present invention.

With reference to FIG. 3, FIG. 3 is a schematic cross-sectional structural view of a reeling structure of the rollable flexible display device provided by the present invention. The flexible display module 101 rolls up on the reel 103 according to a predetermined track. The spiral grooves are defined in two sides of the outer casing 102 respectively. The flexible display module 101 rolls up and stretches around the reel 103 along the spiral grooves. A baffle 1021 is disposed on the outer casing 102 and corresponds to an entrance of the flexible display module 101. A rectangular opening is defined in the baffle 1021 and corresponds the entrance, and a width of the opening is slightly greater than a thickness of the flexible display module 101.

Figure 4:
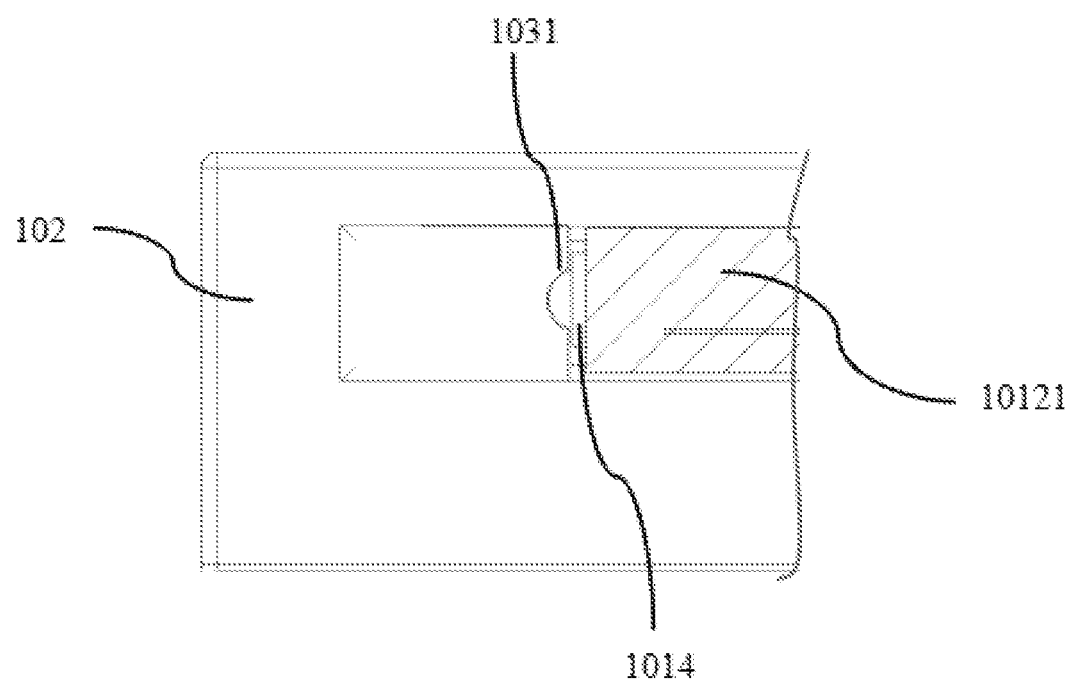
FIG. 4 is a schematic structural view of a first roller mechanism and a second roller mechanism of the rollable flexible display device provided by the present invention.
Figure 5:
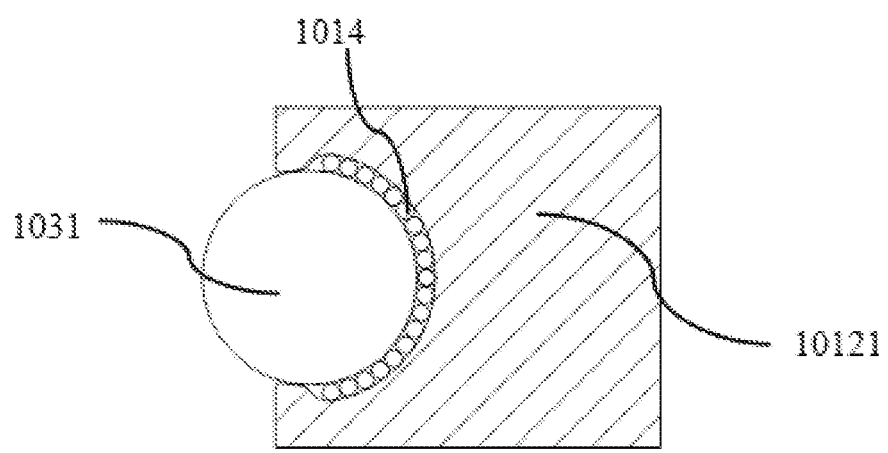
FIG. 5 is a schematic partial view of the first roller mechanism and the second roller mechanism of the rollable flexible display device provided by the present invention provides.

With reference to FIG. 4, FIG. 4 is a schematic structural view of a first roller mechanism and a second roller mechanism of the rollable flexible display device provided by the present invention. The present invention only illustrates a left side portion, an a right side is structurally the same as the left side portion. The first roller mechanisms comprise a first sub-roller mechanism and a second sub-roller mechanism. The first sub-roller mechanism 1014 is disposed on the left side strip structure 10121, the second sub-roller mechanism (not shown in the figures) is disposed on the right side strip structure 10122. The first roller mechanisms comprise the first sub-roller mechanism and the second sub-roller mechanism. The first sub-roller mechanism 1014 comprises universal balls disposed on one side of the flexible display module 101 and arranged along a longitudinal direction. The second sub-roller mechanism universal balls disposed on the other side of the flexible display module and arranged along the longitudinal direction. The second roller mechanisms comprise a third sub-roller mechanism 1031 and a fourth sub-roller mechanism. The third sub-roller mechanism 1031 comprises a universal ball embedded in one of two ends of the reel. The fourth sub-roller mechanism comprises a universal ball embedded in the other end of the reel. The first sub-roller mechanism 1014 rolls around the third sub-roller mechanism 1031. The second sub-roller mechanism rolls around the fourth sub-roller mechanism. The first sub-roller mechanism 1014 and the third sub-roller mechanism 1031 are disposed in a corresponding position. The second sub-roller mechanism and the fourth sub-roller mechanism are disposed in a corresponding position. The first sub-roller mechanism 1014 and the second sub-roller mechanism are the same. The third sub-roller mechanism 1031 and the fourth sub-roller mechanism are the same. With reference to FIG. 5, the first sub-roller mechanism 1014 rolls around a curved surface of the third sub-roller mechanism 1031, and the second sub-roller mechanism rolls around a curved surface of the fourth sub-roller mechanism, which facilitates the strip structures 1012 fully covering the reel 103. A stretched length of the first sub-roller mechanism 1014 is greater than a perimeter of the third sub-roller mechanism 1031. A stretched length of the second sub-roller mechanism is greater than a perimeter of the fourth sub-roller mechanism.

Figure 6:
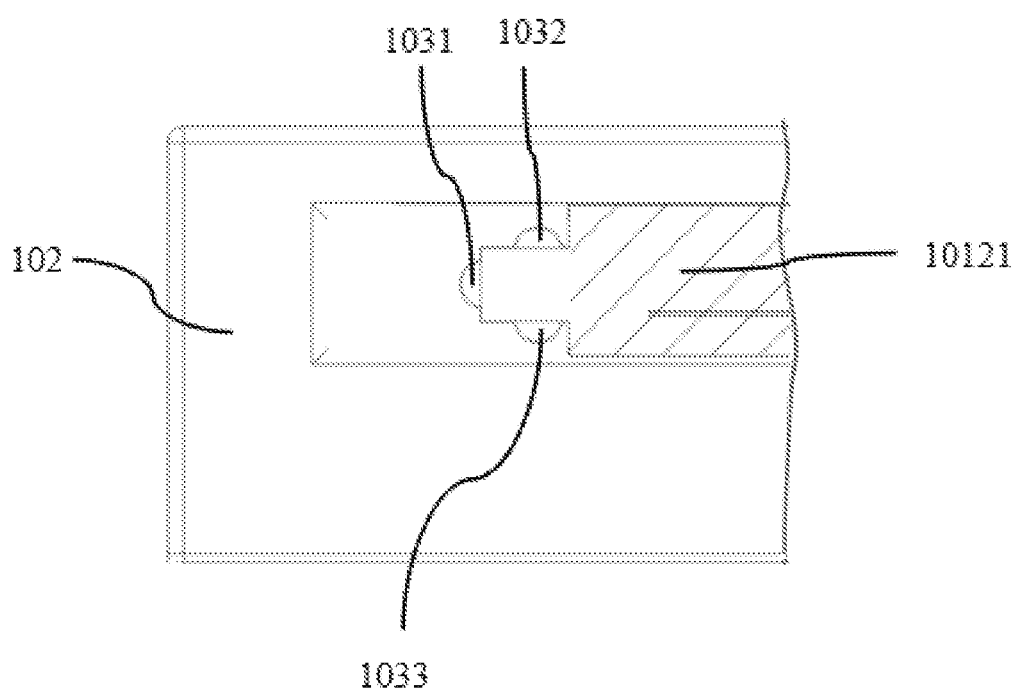
FIG. 6 is a schematic structural view of another first roller mechanisms and second roller mechanism of the rollable flexible display device provided by the present invention.
Figure 7:
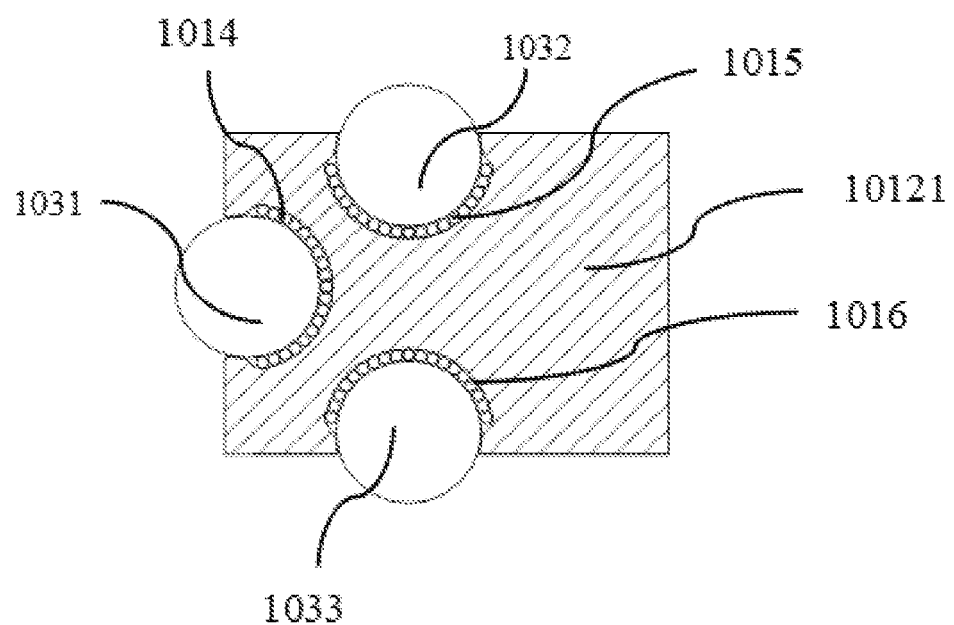
FIG. 7 is a schematic partial view of the another first roller mechanisms and second roller mechanisms of the rollable flexible display device provided by the present invention.

With reference to FIGS. 6 and 7, FIGS. 6 and 7 are schematic structural views of another first roller mechanisms and second roller mechanism of the rollable flexible display device provided by the present invention. The present invention only illustrates a left side portion, and a right side portion is the same as the left side portion structure. Two second auxiliary roller mechanisms 1032, 1033 are disposed symmetrically on each end of the reel 103. Two first auxiliary roller mechanisms 1015, 1016 are disposed on each of the strip structures 1012 and correspond to the second auxiliary roller mechanisms 1032, 1033. Each of the first auxiliary roller mechanisms 1015, 1016 and the second auxiliary roller mechanisms 1032, 1033 is a universal ball assembly. The first auxiliary roller mechanism 1015 rolls around second auxiliary roller mechanism 1032, and the first auxiliary roller mechanism 1016 rolls around the second auxiliary roller mechanism 1033. The second auxiliary roller mechanisms 1032, 1033 are located on two sides of each of the second roller mechanisms 1031 respectively. central points of the two second auxiliary roller mechanisms 1032, 1033 and a central point of the second roller mechanisms form an isosceles triangle. A distance between centers of the two second auxiliary roller mechanisms 1032, 1033 is equal to a thickness of each of the strip structures 1012. As such, the strip structures 1012 are clamped and held between the second auxiliary roller mechanisms 1032, 1033 to prevent the flexible display module 101 from inadvertently shifting during rolling up and stretching.

The present invention provides a rollable flexible display device, the flexible display module of the present invention is covered with the strip structures, material of the strip structures is flexible silicone material, and the strip structures are embedded with universal ball assemblies with a very low sliding resistance, and a special reel mechanism is also used, and distal ends of the reel are disposed with universal ball assemblies. The conventional spiral spring mechanism is replaced, sliding is replaced by rolling to reduce contact friction. The rollable flexible display device employing such special mechanism can drastically decrease the friction to mitigate frequent jammed situation and the un-smooth movement, and to mitigate the issue of an intervening status thereof receiving different inward drag forces to enhance user experience.

Although the preferred embodiments of the present invention have been disclosed as above, the aforementioned preferred embodiments are not used to limit the present invention. The person of ordinary skill in the art may make various changes and modifications without departing from the spirit and scope of the present invention. Therefore, the scope of protection of the present invention is defined by the scope of the claims.

What is claimed is:

1. A rollable flexible display device, comprising a reel and a flexible display module, the flexible display module rolling around the reel or stretching out from the reel under an external force, wherein two strip structures cover two sides of the flexible display module respectively, two first roller mechanisms are disposed on the strip structures respectively, two second roller mechanisms are disposed on two ends of the reel respectively, and the first roller mechanisms roll around the second roller mechanisms respectively during rolling-up or stretching of the flexible display module;

wherein the first roller mechanisms comprise a first sub-roller mechanism and a second sub-roller mechanism, the first sub-roller mechanism comprises universal balls disposed on one side of the flexible display module and arranged along a longitudinal direction, the second sub-roller mechanism comprises universal balls disposed on the other side of the flexible display module and arranged along the longitudinal direction;

the second roller mechanisms comprise a third sub-roller mechanism and a fourth sub-roller mechanism, the third sub-roller mechanism comprises a universal ball embedded in one of two ends of the reel, the fourth sub-roller mechanism comprises a universal ball embedded in the other end of the reel, the first sub-roller mechanism rolls around the third sub-roller mechanism, and the second sub-roller mechanism rolls around the fourth sub-roller mechanism;

wherein two second auxiliary roller mechanisms are disposed symmetrically on each end of the reel respectively, two first auxiliary roller mechanisms are disposed on each of the strip structures and correspond to the second auxiliary roller mechanisms, and the first auxiliary roller mechanisms roll around the second auxiliary roller mechanisms respectively;

wherein the two second auxiliary roller mechanisms are located on two sides of each of the second roller mechanisms, and central points of the two second auxiliary roller mechanisms and a central point of the second roller mechanisms form an isosceles triangle; and wherein a distance between centers of the two second auxiliary roller mechanisms is equal to a thickness of each of the strip structures.

2. The rollable flexible display device as claimed in claim 1, wherein material of the strip structures is flexible silicone material, and the flexible silicone material has elasticity and prestress.

3. The rollable flexible display device as claimed in claim 1, wherein a stretched length of the first sub-roller mechanism is greater than a perimeter of the third sub-roller mechanism, and a stretched length of the second sub-roller mechanism is greater than a perimeter of the fourth sub-roller mechanism.

4. The rollable flexible display device as claimed in claim 1, wherein the display device further comprises an outer casing, two spiral grooves are defined in two inner sides of the outer casing respectively, the flexible display module stretches and retracts around the reel and along the grooves, and a baffle is disposed on the outer casing corresponding to an entrance of the flexible display module.

5. The rollable flexible display device as claimed in claim 1, wherein the flexible display module is an organic light emitting diode (OLED) display device or a Mini-LED display device.

6. The rollable flexible display device as claimed in claim 1, wherein a size of each of universal balls of the first roller mechanisms is less than a size of each of the universal balls of the second roller mechanisms.

7. A rollable flexible display device, comprising a reel and a flexible display module, the flexible display module rolling around the reel or stretching out from the reel under an external force, wherein two strip structures cover two sides of the flexible display module respectively, two first roller mechanisms are disposed on the strip structures respectively, two second roller mechanisms are disposed on two ends of the reel respectively, and the first roller mechanisms roll around the second roller mechanisms respectively during rolling-up or stretching of the flexible display module, wherein the second roller mechanisms comprises a universal ball disposed slidably on the reel, each of the first roller mechanisms comprises circular recesses and universal balls disposed in inner surfaces of the circular recesses respectively, and the universal ball of each of the second roller mechanisms and the circular recesses of each of the first roller mechanisms are disposed in a corresponding position;

wherein the first roller mechanisms comprise a first sub-roller mechanism and a second sub-roller mechanism, the first sub-roller mechanism comprises universal balls disposed on one side of the flexible display module and arranged along a longitudinal direction, the second sub-roller mechanism comprises universal balls disposed on the other side of the flexible display module and arranged along the longitudinal direction; the second roller mechanisms comprise a third sub-roller mechanism and a fourth sub-roller mechanism, the third sub-roller mechanism comprises a universal ball embedded in one of two ends of the reel, the fourth sub-roller mechanism comprises a universal ball embedded in the other end of the reel, the first sub-roller mechanism rolls around the third sub-roller mechanism, and the second sub-roller mechanism rolls around the fourth sub-roller mechanism;

wherein two second auxiliary roller mechanisms are disposed symmetrically on each end of the reel respectively, two first auxiliary roller mechanisms are disposed on each of the strip structures and correspond to the second auxiliary roller mechanisms, and the first auxiliary roller mechanisms roll around the second auxiliary roller mechanisms respectively;

wherein the two second auxiliary roller mechanisms are located on two sides of each of the second roller mechanisms, and central points of the two second auxiliary roller mechanisms and a central point of the second roller mechanisms form an isosceles triangle; and wherein a distance between centers of the two second auxiliary roller mechanisms is equal to a thickness of each of the strip structures.

8. The rollable flexible display device as claimed in claim 7, wherein material of the strip structures is flexible silicone material, the flexible silicone material has elasticity and prestress.

9. The rollable flexible display device as claimed in claim 7, wherein a stretched length of the first sub-roller mechanism is greater than a perimeter of the third sub-roller mechanism, and a stretched length of the second sub-roller mechanism is greater than a perimeter of the fourth sub-roller mechanism.

10. The rollable flexible display device as claimed in claim 7, wherein the display device further comprises an outer casing, two spiral grooves are defined in two inner sides of the outer casing respectively, the flexible display module stretches and retracts around the reel and along the grooves, and a baffle is disposed on the outer casing corresponding to an entrance of the flexible display module.

11. The rollable flexible display device as claimed in claim 7, wherein the flexible display module is an organic light emitting diode (OLED) display device or a Mini-LED display device.

12. The rollable flexible display device as claimed in claim 7, wherein a size of each of the universal balls of the first roller mechanisms is less than a size of each of the universal balls of the second roller mechanisms.

* * * * *